(12) United States Patent
Ng

(10) Patent No.: US 9,876,494 B2
(45) Date of Patent: Jan. 23, 2018

(54) HIGH VOLTAGE SWITCHING OUTPUT DRIVER

(71) Applicant: MAXIM Integrated Products, Inc., San Jose, CA (US)

(72) Inventor: Eddie Lok Chuen Ng, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 21 days.

(21) Appl. No.: 14/499,081

(22) Filed: Sep. 26, 2014

(65) Prior Publication Data

US 2015/0261235 A1    Sep. 17, 2015

Related U.S. Application Data

(60) Provisional application No. 61/952,862, filed on Mar. 13, 2014.

(51) Int. Cl.
| | |
|---|---|
| H03B 1/00 | (2006.01) |
| H03K 17/66 | (2006.01) |
| G05F 1/595 | (2006.01) |
| H03K 17/10 | (2006.01) |
| H03K 17/0412 | (2006.01) |

(52) U.S. Cl.
CPC ........... H03K 17/668 (2013.01); G05F 1/595 (2013.01); H03K 17/04123 (2013.01); H03K 17/102 (2013.01)

(58) Field of Classification Search
CPC ....... H03K 19/00361; H03K 19/00315; H03K 19/01852; H03K 19/001; H03K 19/00384; H03K 19/018521; H03K 19/09448; H03K 19/01714; H03K 19/01806; H03K 17/04126; H03K 5/022; H03K 5/0216; G11B 5/022
USPC ........ 327/108, 109, 110, 111, 112, 333, 544; 326/31–34, 80–92
See application file for complete search history.

(56) References Cited

U.S. PATENT DOCUMENTS

2011/0309873 A1* 12/2011 Miller .............. H03K 19/01852
                                                           327/333
2013/0076320 A1*  3/2013 Chan ................... H02M 3/1588
                                                           323/271

* cited by examiner

*Primary Examiner* — Nguyen Tran
(74) *Attorney, Agent, or Firm* — TIPS Group

(57) ABSTRACT

A high voltage output driver circuit includes a first regulator having a first input, a second input, and an output coupled to the second input, a second regulator having a first input, a second input and an output, a driver having a first signal input, a second signal input, a first control input coupled to the output of the first regulator, a second control input coupled to the output of the second regulator, a first control output, and a second control output, a first power transistor coupled to the first control output of the driver, and a second power transistor coupled to the second control output of the driver. An integrated circuit comprising the high voltage output driver does not require external bootstrap components, such as capacitors, nor the attendant extra pins required to connect to such external bootstrap components.

8 Claims, 2 Drawing Sheets

HIGH VOLTAGE SWITCHING OUTPUT DRIVER

CROSS REFERENCE TO RELATED APPLICATION

This application claims the benefit of U.S. Ser. No. 61/952,862, filed Mar. 13, 2014, incorporated herein by reference.

BACKGROUND

High voltage switching output drivers are used for many electronic applications. For example, high voltage switching output drivers are used in high voltage output stages, class D amplifiers, direct current to direct current (DC-to-DC) converters, and Power Management Integrated Circuits (PMICs).

A class-D amplifier or switching amplifier is an electronic amplifier where all power devices (typically power transistors) are operated as binary switches. These power transistors are often Metal Oxide Semiconductor Field Effect Transistors (MOSFETs). In operation, the MOSFETs are typically either fully on or fully off. A DC-to-DC converter is an electronic circuit which converts a source of direct current (DC) from one voltage level to another, and are often used in battery powered electronic devices. High voltage switching output drivers can be used in conjunction with the voltage conversion. While a PMIC may more than one function, DC to DC conversion and voltage scaling, both of which can rely upon high voltage switching output drivers, can be employed.

FIG. 1 is a block diagram of a conventional high voltage switching output driver 10, which is typically formed as part of an integrated circuit (IC) 12. External to the prior art output driver 10 are a pair of bypass capacitors 14 and 16. Prior art high voltage switching output driver 10 includes a pair of low dropout (LDO) regulators labelled LDO1 and LDO2. The output driver 10 also includes a first output driver D1, a second output driver D2, a first power output MOSFET MP1 and a second power output MOSFET MN1. A first input IN1 is coupled to output driver D1 and a second input IN2 is coupled to output driver D2. The two inputs IN2 and IN2 can be differential inputs, or they can be coupled together as single non-differential input.

The high voltage rail 18 for the high voltage switching output driver 10 is at a level PVDD and can be, for example, 20 volts DC (VDC). Ground (PGND) can be at zero VDC, and the outputs of regulators LDO1 and LDO2 can be at 15 VDC and 5 VDC in this example. The drivers D1 and D2 control the MOSFETS MP1 and MN1 to provide the output OUT for driving a load (not shown).

As well known to those of skill in the art, an LDO regulator is a DC linear voltage regulator which can operate with a very small input-output differential voltage. The advantages of a low dropout voltage include a lower minimum operating voltage, higher efficiency operation, and lower heat dissipation. Typically, the main components of an LDO regulator include a power Field Effect Transistor (FET) and a differential ("error") amplifier. A first input of the differential amplifier is coupled to a stable voltage reference and a second input of the differential amplifier monitors its output. If the output voltage rises too high relative to the reference voltage, the drive to the power FET is adjusted to maintain a constant output voltage.

It should be noted that, in the prior art output driver 10, the drivers D1 and D2 draw significant current from regulators LDO1 and LDO2. The external capacitors 14 and 16, which have values in at least the microfarad range, are required to provide sufficient quantities of current upon demand by the drivers. The need for external capacitors requires that the package for IC 12 have additional pins, which increases the cost and size of the package. Also, the printed circuit board supporting the IC 12 and the capacitors 14 and 16 must be increased in size. Furthermore, the capacitors add additional component and assembly costs to an electronic device.

It will therefore be appreciated that prior art solutions typically require external bootstrap or LDO capacitors (caps) which are costly and which require extra pins on the package of the integrated circuit (IC). It would be advantageous to provide an IC integrating a high voltage switching output driver that does not require external bootstrap components and the attendant extra pins to connect to such external bootstrap components.

These and other limitations of the prior art will become apparent to those of skill in the art upon a reading of the following descriptions and a study of the several figures of the drawing.

SUMMARY

In an embodiment, set forth by way of example and not limitation, a class AB loop is used to drive output power FETs of a switching output driver. In this non-limiting example, high and low side drivers are combined into one, where current is only drawn from PVDD to PGND, not from PVDD to LDO nor LDO to PGND. The LDO voltages are used as reference to the gates of driver FETs, allowing LDOs to be internally bypassed, and thereby eliminating the need for external capacitors.

In an embodiment, set forth by way of example and not limitation, a high voltage output driver circuit includes a first regulator having a first input, a second input, and an output coupled to the second input, a second regulator having a first input, a second input and an output, a driver having a first signal input, a second signal input, a first control input coupled to the output of the first regulator, a second control input coupled to the output of the second regulator, a first control output, and a second control output, a first power transistor coupled to the first control output of the driver, a second power transistor coupled to the second control output of the driver.

In an example, set forth by way of example and not limitation, a driver includes a first translinear loop circuit operative to develop a first control output, a second translinear loop circuit operative to develop a second control output. a first signal input device coupled to the first translinear loop circuit, a second signal input device coupled to the second translinear loop circuit, a first control input device coupling the first translinear loop circuit to the second translinear loop circuit, and a second control input device coupling the second translinear loop circuit to the first translinear loop circuit.

Advantageously, in certain example embodiments, the circuit draws only a small transient current from the gate drive reference voltage source, thereby eliminating the need for the external bootstrap or LDO capacitors ("caps") while driving high voltage devices. This saves IC pin count, printed circuit board (PCB) space and the relatively high costs associated with external capacitors.

Advantageously, certain example embodiments are well suited for use in HV switching and non-switching output devices, e.g. in high voltage (HV) analog blocks and switches. By way of non-limiting examples, certain embodiments are well adapted to high voltage class D amplifiers, high voltage DC-DC converters and high voltage analog linear output devices.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENT(S)

Figure 1:
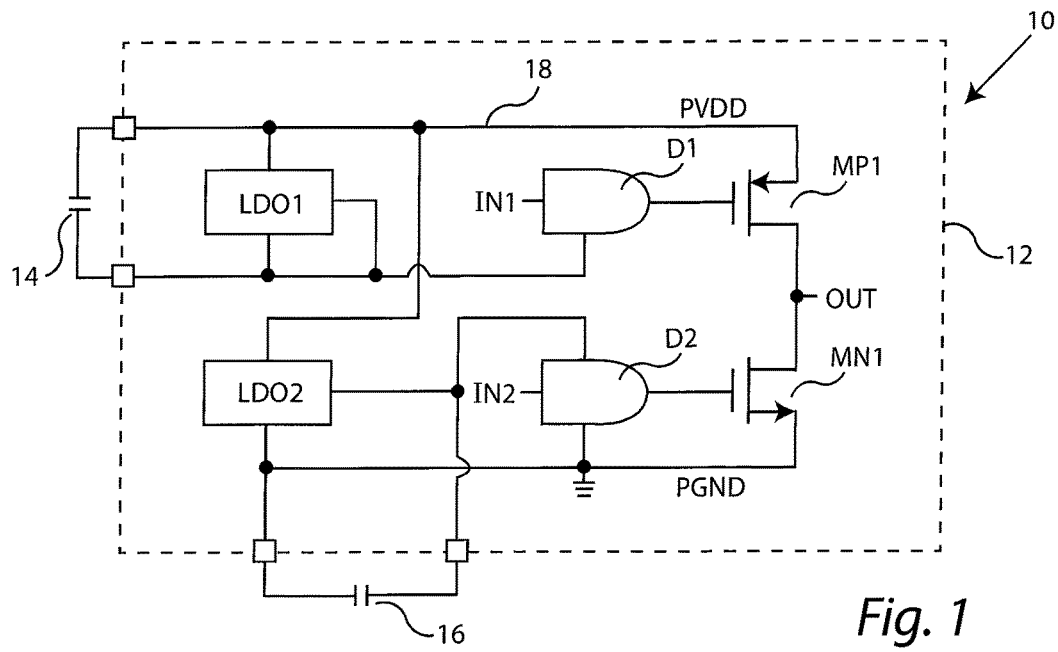
FIG. 1 is a block diagram of a conventional high voltage switching output driver which requires external capacitors for its operation.
Figure 2:
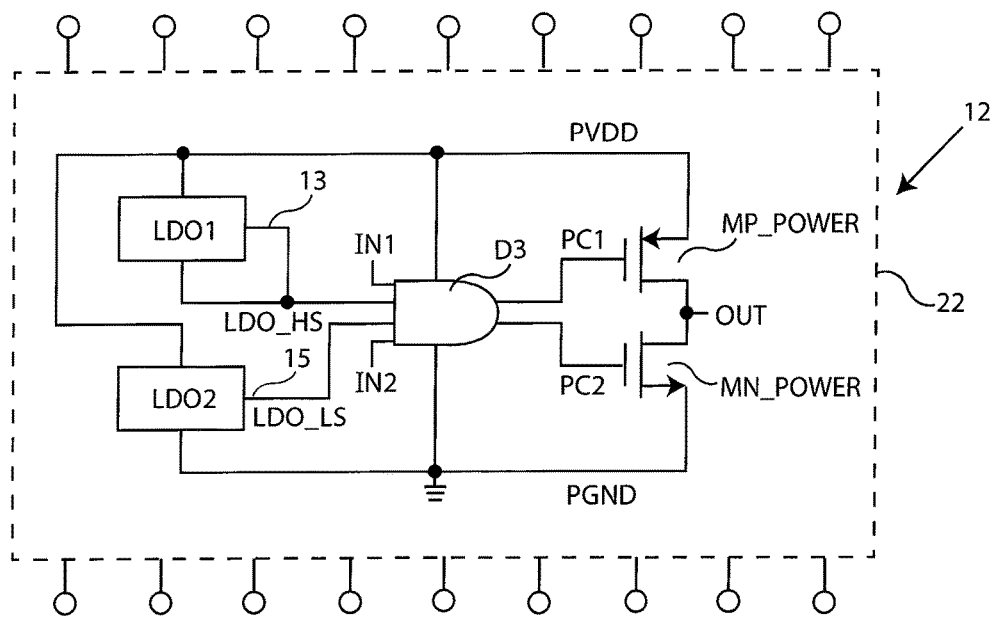
FIG. 2 is a block diagram, set forth by way of example and not limitation, of an improved high voltage output driver which does not require external capacitors for its operation.

FIG. 1 was described in relation to the prior art. FIG. 2 is a block diagram, set forth by way of example and not limitation, of an improved high voltage output driver 20, preferably formed as part of an integrated circuit (IC) 22, which does not require external capacitors for its operation. As will be appreciated by those of skill in the art, IC 22 includes at least one IC die or "chip" for the circuitry, a package for the chip provided with a number of pins, leads or contacts, and wires or other electrical connectors connecting the circuitry of the chip to the pins of the package.

In the example embodiment of FIG. 2, high voltage output driver 20 includes a first regulator LDO1, a second regulator LDO2, a driver D3, a first power MOSFET MP_POWER, and a second power MOSFET MN_POWER. For example, DMOS high voltage MOSFETS may be employed. No external capacitors are required in this embodiment, thereby reducing the required pin count and size of the package of IC 22. In this non-limiting example, the driver D3 takes the place of both the high and low side drivers of the prior art, current is only drawn from PVDD to ground (PGND), not from the LDO regulators, as in the prior art.

In this non-limiting example, the regulator LDO1 has an output with small parasitic capacitance 13 of LDO_HS, a first input coupled to PVDD and a second input coupled to its output 13. Also in this example, regulator LDO2 has an output with small parasitic capacitance 15 of LDO_LS, a first input coupled to PGND, and a second input coupled to PVDD. LDO_HS and LDO_LS are inputs to the driver D3, along with a first signal input IN1 and a second signal input IN2. Driver D3 is coupled between PVDD and ground, has additional inputs of IN1 and IN2, and has control outputs PC1 and PC2 which control power MOSFET MP_POWER and MOSFET MN_POWER, respectively. The inputs IN1 and IN2 can be separate, differential inputs, or can be coupled together as a single input.

In this non-limiting example, PVDD can be 20 VDC, LDO_HS can be 15 VDC, LDO_LS can be 5 VDC and ground can be 0 VDC. As will be described in greater detail subsequently with reference to an example driver D3' of FIG. 3, the outputs with small parasitic capacitances 13 and 15 of regulators LDO1 and LDO2, respectively, function to drive the gates of the power MOSFETs, and therefore do not have to provide large current transients to power drivers, as was the case with the prior art. Therefore, the small parasitic capacitances, in the picofarad range, at the outputs 13 and 15 of regulators LDO1 and LDO2, respectively, are sufficient to control the gates of MOSFET MP_POWER and MOSFET MN_POWER, and no expensive external capacitors are required.

It will be noted that, in this non-limiting example, a class AB loop is used to drive output power FETs of a switching output driver. In this non-limiting example, high and low side drivers are combined into one, where current is only drawn from PVDD to PGND, not from PVDD to LDO nor LDO to PGND as in the prior art. That is, in the forgoing example embodiments, LDO voltages are used as reference to the gates of driver FETs, allowing LDOs to be internally bypassed, and thereby eliminating the need for external capacitors.

As noted previously, prior art solutions required external bootstrap or LDO capacitors ("caps") which are costly and require extra pins on the IC package. It will therefore be appreciated that in example embodiments disclosed herein the need for the external bootstrap or LDO capacitors caps for high voltage LDOs while driving high voltage devices is eliminated, and fewer pins are required on the IC package.

Figure 3:
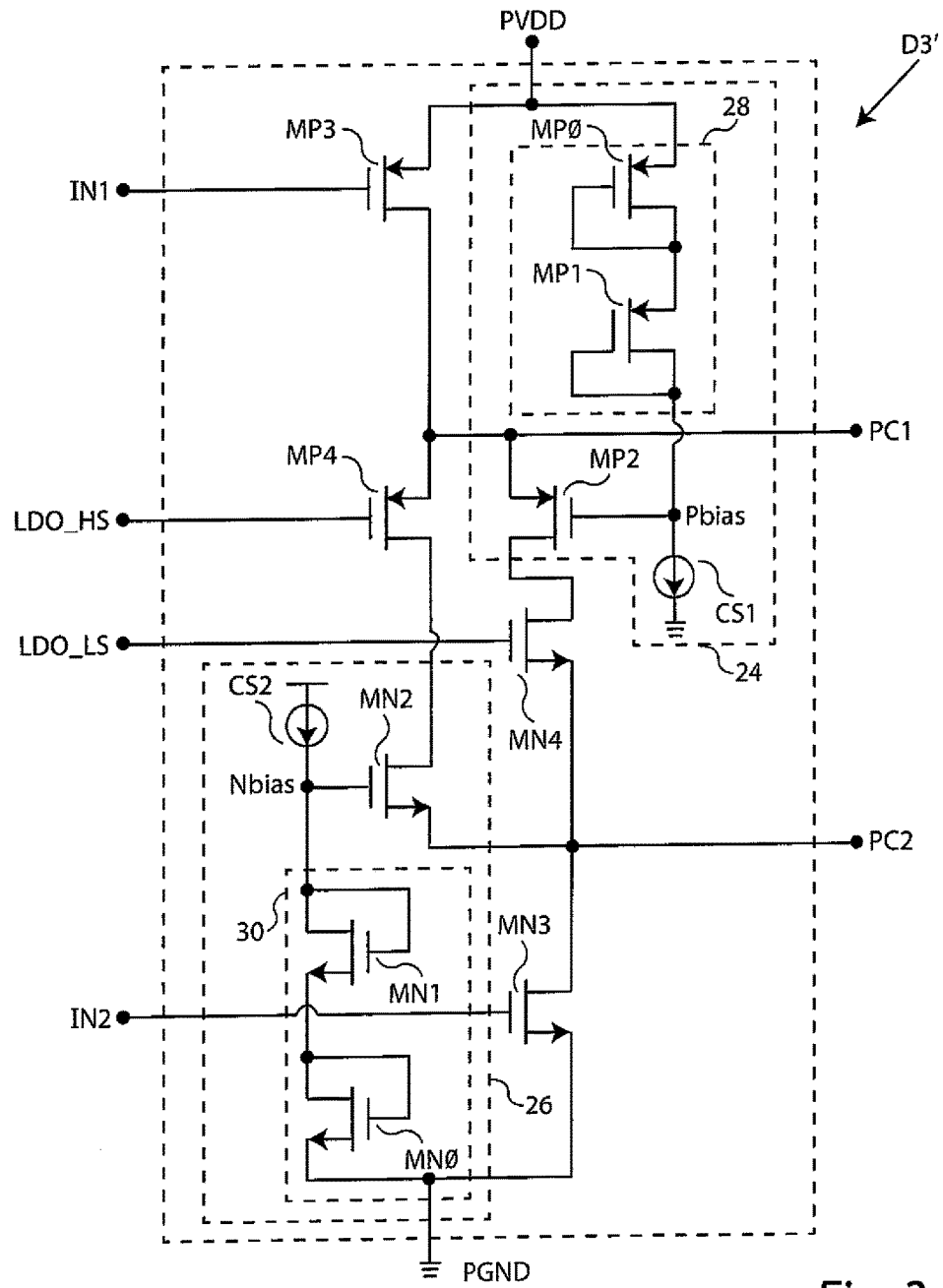
FIG. 3 is a schematic, set forth by way of example and not limitation, of an output driver D3' of FIG. 2.

FIG. 3 is a schematic, set forth by way of example and not limitation, of an output driver D3' of FIG. 2. In this non-limiting example, driver D3' includes p-channel MOSFETS (a/k/a PMOS transistors) MP0, MP1, MP2, MP3 and MP4 and n-channel MOSFETS (a/k/a NMOS transistors) MN0, MN1, MN2, MN3 and MN4. As used herein a transistor of a "first polarity type" is one of a p-channel ("p-type") and an n-channel ("n-type") transistor, and a transistor of a "second polarity type" is the other of a p-channel ("p-type") and an n-channel ("n-type") transistor.

Output driver D3' further includes a current source CS2 which, in conjunction with reference bias transistors MN0 and MN1 (which provide two diode voltage drops), provides a bias $N_{bias}$ at the gate of NMOS transistor MN2 and a current source CS1 which, in conjunction with reference bias transistors MP0 and MP1 (which provide two diode voltage drops), provides a bias $P_{bias}$ at the gate of PMOS transistor MP2. Transistors MP0, MP1 and MP2, along with current source CS1 comprise a first translinear loop 24 having a first control output PC1 and transistors MN0, MN1 and MN2, along with current source CS2, comprise a second translinear loop 26 having a second control output PC2.

It will be appreciated that driver D3', in this non-limiting example, includes a first translinear loop circuit 24 operative to develop a first control output PC1, a second translinear loop circuit 26 operative to develop a second control output PC2, a first signal input device MP3 coupled to the first translinear loop circuit 24, a second signal input device MN3 coupled to the second translinear loop circuit 26, a first control input device MP4 coupled to both the first translinear loop circuit 24 and the second translinear loop circuit 26, and a second control input device MN4 coupled to both the second translinear loop circuit 26 and the first translinear loop circuit 24.

In the non-limiting example of FIG. 3, the first translinear loop circuit includes a first current source CS1, a first voltage drop device 28, and a first bias transistor MP2 which is coupled to a node $P_{bias}$ between the first current source CS1 and the first voltage drop device 28. Also in this example, the second translinear loop circuit 26 includes a second current source CS2, a second voltage drop device 30, and a second bias transistor MN2 coupled to a node $N_{bias}$ between the second current source CS2 and second voltage drop device 28. In this non-limiting example, the voltage drop devices 28 and 30 each comprise a pair of MOSFETS configured as diodes, thereby each providing a two-diode voltage drop.

It should be noted that the driver D3' does not derive its power from the regulators, as was the case with drivers in the prior art. Instead, the outputs LDO_HS and LDO_LS of the regulators control the gates of MOSFET MP4 and MOSFET MN4, respectively, and therefore draw negligible amounts of current from the regulators. As such, external capacitors to store charges for the large current transients generated by drivers of the prior art are not required.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A high voltage output driver circuit comprising:
   a first regulator having a first input connected to a first power supply voltage (PVDD), a second input, and an output coupled to the second input, wherein a first capacitance at the output of first regulator is only a small parasitic capacitance in the picofarad range;
   a second regulator having a first input connected to a second power supply voltage (PGND), a second input coupled to the PVDD, and an output, wherein a second capacitance at the output of the second regulator is only a small parasitic capacitance in the picofarad range;
   a driver drawing a current exclusively from PVDD to PGND, having a first signal input, a second signal input, a first control input coupled to the output of the first regulator, a second control input coupled to the output of the second regulator, a first control output, and a second control output, the driver including
   (a) a first translinear loop circuit operative to develop a first control output;
   (b) a second translinear loop circuit operative to develop a second control output;
   (c) a first signal input device coupled to the first translinear loop circuit;
   (d) a second signal input device coupled to the second translinear loop circuit;
   (e) a first control input MOSFET device coupling the first translinear loop circuit to the second translinear loop circuit, wherein a gate of the first control input MOSFET device is controlled by the output of the first regulator; and
   (f) a second control input MOSFET device coupling the second translinear loop circuit to the first translinear loop circuit, wherein a gate of the second control input MOSFET device is controlled by the output of the second regulator;
   a first power transistor coupled to the first control output of the driver; and
   a second power transistor coupled to the second control output of the driver;
   wherein the first regulator, the second regulator, the driver, the first power transistor and the second power transistor comprise an integrated circuit (IC) having a plurality of pins; and
   wherein none of the plurality of pins are electrically connected to the first regulator and none of the plurality of pins are electrically connected to the second regulator such that an external bootstrap component cannot be connected to either the first regulator or the second regulator.

2. A high voltage output driver circuit as recited in claim 1 wherein the first power transistor is power Field Effect Transistor (FET) of a first polarity and the second power transistor is a power FET of a second polarity.

3. A high voltage output driver circuit as recited in claim 2 wherein the first power transistor is a p-type MOSFET and the second power transistor is an n-type MOSFET.

4. A high voltage output driver circuit as recited in claim 3 wherein a gate of the first power transistor is coupled to the first control output of the driver and a gate of the second power transistor is coupled to the second control output of the driver.

5. A high voltage output driver circuit as recited in claim 4 wherein a source of the first power transistor is coupled to PVDD and a source of the second power transistor is coupled to PGND.

6. A high voltage output driver circuit as recited in claim 5 wherein a drain of the first power transistor and a drain of the second power transistor are coupled together at a driver circuit output node.

7. A high voltage output driver circuit as recited in claim 6 wherein the driver is coupled to PVDD and PGND.

8. A high voltage output driver circuit as recited in claim 7 wherein the first regulator and the second regulator are low dropout (LDO) regulators.

* * * * *